United States Patent

Dhuler et al.

(12) 
(10) Patent No.: US 6,351,580 B1
(45) Date of Patent: Feb. 26, 2002

(54) MICROELECTROMECHANICAL DEVICES HAVING BRAKE ASSEMBLIES THEREIN TO CONTROL MOVEMENT OF OPTICAL SHUTTERS AND OTHER MOVABLE ELEMENTS

(75) Inventors: Vijayakumar Rudrappa Dhuler, Raleigh; Edward A. Hill, Chapel Hill, both of NC (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/536,877

(22) Filed: Mar. 27, 2000

(51) Int. Cl.$^7$ .................................................. G02B 6/42
(52) U.S. Cl. ............................. 385/19; 385/14; 385/15; 385/147; 385/136; 385/137
(58) Field of Search ......................... 385/15, 16, 17, 385/18, 19, 20, 24, 147, 14, 136, 137; 396/452, 453, 454, 455, 457

(56) References Cited

U.S. PATENT DOCUMENTS

| | | | | |
|---|---|---|---|---|
| 4,204,762 A | * | 5/1980 | Date et al. ................... 354/242 |
| 4,641,036 A | | 2/1987 | Ohno et al. .................. 250/574 |
| 4,705,349 A | | 11/1987 | Reedy ....................... 385/19 X |
| 4,725,127 A | | 2/1988 | Malinge et al. ........... 385/19 X |
| 4,815,827 A | | 3/1989 | Lane ......................... 385/19 X |
| 4,828,362 A | | 5/1989 | Skinner et al. ........... 385/15 X |
| 4,829,329 A | * | 5/1989 | Toyoda et al. ............... 354/252 |
| 4,850,697 A | | 7/1989 | Schoennauer et al. ....... 356/419 |
| 4,878,729 A | | 11/1989 | Stewart ..................... 385/19 X |
| 4,938,555 A | | 7/1990 | Savage ...................... 385/19 X |
| 4,948,223 A | | 8/1990 | Anderson et al. .......... 385/19 X |
| 5,004,318 A | * | 4/1991 | Ohashi ...................... 385/19 X |
| 5,016,978 A | * | 5/1991 | Fargette et al. ................ 385/19 |
| 5,024,500 A | | 6/1991 | Stanley et al. ............. 385/19 X |
| 5,031,994 A | | 7/1991 | Emmons ................... 385/19 X |
| 5,042,889 A | | 8/1991 | Benzoni ....................... 385/16 |
| 5,052,777 A | | 10/1991 | Ninnis et al. .................. 385/19 |
| 5,208,880 A | | 5/1993 | Riza et al. ..................... 385/18 |
| 5,226,099 A | * | 7/1993 | Mignardi et al. ............. 385/19 |

(List continued on next page.)

FOREIGN PATENT DOCUMENTS

| | | | | |
|---|---|---|---|---|
| EP | 0 510 629 A1 | 10/1992 | ............... 385/19 X |
| JP | 11-119129 A | 4/1999 | ............... 385/19 X |

*Primary Examiner*—Brian Healy
(74) *Attorney, Agent, or Firm*—Myers Bigel Sibley & Sajovec

(57) ABSTRACT

Microelectromechanical devices may include a substrate having first and second optical fibers thereon. An optical shutter may also be provided. This optical shutter is mechanically coupled to a first plurality of arched beams that are supported at opposing ends by support structures which may be mounted on the substrate. A second plurality of arched beams are also provided on a first side of the optical shutter. These arched beams are also supported at opposing ends by support structures. A first brake member is provided that is coupled to the second plurality of arched beams. This first brake member contacts and restricts the optical shutter from moving in the ±y-direction when the second plurality of arched beams are relaxed, but releases the optical shutter when the second plurality of arched beams move in the −x direction. This ability to restrict movement of the optical shutter when the second plurality of arched beams are relaxed provides a degree of nonvolatile position retention. A third plurality of arched beams are also preferably provided on a second side of the optical shutter. A second brake member, which is coupled to the third plurality of arched beams, also contacts and restricts the shutter member from moving in the ±y direction when the third plurality of arched beams are relaxed, but releases the optical shutter when the third plurality of arched beams move in the +x direction.

23 Claims, 7 Drawing Sheets

U.S. PATENT DOCUMENTS

| | | | |
|---|---|---|---|
| 5,268,974 A | 12/1993 | Hikita et al. | 385/19 |
| 5,311,410 A | 5/1994 | Hsu et al. | 362/20 |
| 5,321,774 A | 6/1994 | Barnard et al. | 385/16 |
| 5,375,033 A | 12/1994 | MacDonald | 361/281 |
| 5,623,564 A | 4/1997 | Presby | 385/20 |
| 5,664,247 A * | 9/1997 | Hasuda et al. | 396/456 |
| 5,748,812 A | 5/1998 | Buchin | 385/18 |
| 5,761,350 A | 6/1998 | Koh | 385/14 |
| 5,764,823 A | 6/1998 | Shapanus et al. | 385/19 |
| 5,771,321 A | 6/1998 | Stern | 385/31 |
| 5,828,800 A | 10/1998 | Henry et al. | 385/20 |
| 5,838,845 A | 11/1998 | Leone et al. | 385/16 |
| 5,864,643 A | 1/1999 | Pan | 385/33 |
| 5,870,518 A | 2/1999 | Haake et al. | 385/90 |
| 5,889,898 A | 3/1999 | Koren et al. | 385/9 |
| 5,892,862 A | 4/1999 | Kidder et al. | 385/16 |
| 5,909,078 A | 6/1999 | Wood et al. | 310/307 |
| 5,911,018 A | 6/1999 | Bischel et al. | 385/16 |
| 5,914,801 A | 6/1999 | Dhuler et al. | 359/230 |
| 5,920,665 A | 7/1999 | Presby | 385/16 |
| 5,923,798 A | 7/1999 | Aksyuk et al. | 385/19 |
| 5,930,416 A | 7/1999 | Worm et al. | 385/16 |
| 5,933,269 A | 8/1999 | Robinson | 359/280 |
| 5,955,817 A | 9/1999 | Dhuler et al. | 310/307 |
| 5,959,338 A | 9/1999 | Youngner et al. | 257/419 |
| 5,960,132 A | 9/1999 | Lin | 385/18 |
| 5,962,949 A | 10/1999 | Dhuler et al. | 310/307 |
| 6,108,466 A * | 8/2000 | Aksyuk et al. | 385/19 |
| 6,205,267 B1 * | 3/2001 | Aksyuk et al. | 385/19 |

* cited by examiner

MICROELECTROMECHANICAL DEVICES HAVING BRAKE ASSEMBLIES THEREIN TO CONTROL MOVEMENT OF OPTICAL SHUTTERS AND OTHER MOVABLE ELEMENTS

FIELD OF THE INVENTION

The present invention relates to electromechanical devices and, more particularly, to microelectromechanical devices.

BACKGROUND OF THE INVENTION

Microelectromechanical systems (MEMS) have recently been developed as alternatives for conventional electromechanical devices such as relays, actuators, valves and sensors. MEMS devices are potentially low cost devices, due to the use of microelectronic fabrication techniques. New functionality may also be provided because MEMS devices can be much smaller than conventional electromechanical devices.

Many applications of MEMS technology use MEMS actuators. For example, U.S. Pat. No. 5,923,798 to Aksyuk et al. discloses a micro-machined optical switch that utilizes an electrostatically-driven actuator comprising hinged plates. In particular, the '798 patent discloses an "in-plane" optical switch having an actuator formed by two vertically-oriented electrodes and linkage from the actuator to an optical device. One of the electrodes is movable and the other is fixed. The optical device is positioned in close proximity to two spaced optical fibers that are aligned to optically communicate with one another. The optical device is movable in and out of an optical path defined by the optical cores of the optical fibers upon application of a horizontal or in-plane displacement of sufficient magnitude. As a voltage is applied across the electrodes by a controlled voltage source, the movable electrode swings towards the fixed electrode. The substantially horizontal displacement of the movable electrodes is transferred, by the linkage, to the optical device. As a result, the optical device moves horizontally or in-plane along a path that places it in, or out of, the optical path as a function of the back and forth oscillatory-type motion of the movable electrode.

Unfortunately, conventional optical switches such as those described in the '798 patent may require the continuous presence of an electrostatic potential across a pair of electrodes to maintain the optical device in a blocking position within the optical path. Accordingly, not only will the switch need to be continuously powered, but an interruption of power to the switch may cause the switch to reset. Thus, notwithstanding conventional microelectromechanical devices, there continues to be a need for improved microelectromechanical devices having reduced power consumption requirements and reduced susceptibility to power interruptions.

SUMMARY OF THE INVENTION

It is therefore an object of the present invention to provide improved microelectromechanical devices.

It is another object of the present invention to provide microelectromechanical optical devices having optical shutters therein that can block and/or redirect optical beams.

It is still another object of the present invention to provide microelectromechanical optical devices having nonvolatile characteristics.

These and other objects, advantages and features of the present invention may be provided by preferred microelectromechanical optical devices that include a substrate having first and second optical fibers thereon. The first and second optical fibers are positioned so that an end of the first optical fiber faces an end of the second optical fiber. An optical shutter is also provided. This optical shutter is mechanically coupled to a first plurality of arched beams that are supported at opposing ends by support structures which may be mounted on the substrate. A second plurality of arched beams are also provided on a first side of the optical shutter. These arched beams are also supported at opposing ends by support structures. According to a preferred aspect of the present invention, a first brake member is provided that is coupled to the second plurality of arched beams. This first brake member contacts and restricts the optical shutter from moving in the ±y-direction when the second plurality of arched beams are relaxed, but releases the optical shutter when the second plurality of arched beams move in the −x direction. This ability to restrict movement of the optical shutter when the second plurality of arched beams are relaxed provides a degree of nonvolatile position retention. A third plurality of arched beams are also preferably provided on a second side of the optical shutter. A second brake member, which is coupled to the third plurality of arched beams, also contacts and restricts the shutter member from moving in the ±y direction when the third plurality of arched beams are relaxed, but releases the optical shutter when the third plurality of arched beams move in the +x direction.

The first plurality of arched beams, which are mechanically coupled to the optical shutter, can be used to control movement of the optical shutter into a gap extending between the ends of the first and second optical fibers. In this position, the optical shutter can operate to limit the degree of optical coupling between the first and second optical fibers and can even be positioned to block all light from being transferred from one fiber to the other. The first and second brake members and the second and third pluralities of arched beams may collectively form a "normally-locked" brake assembly where the preferably diametrically opposing ends of the first and second brake members contact and restrict movement of the optical shutter or other movable element when the second and third pluralities of arched beams are in relaxed states.

DESCRIPTION OF PREFERRED EMBODIMENTS

Figure 1A:
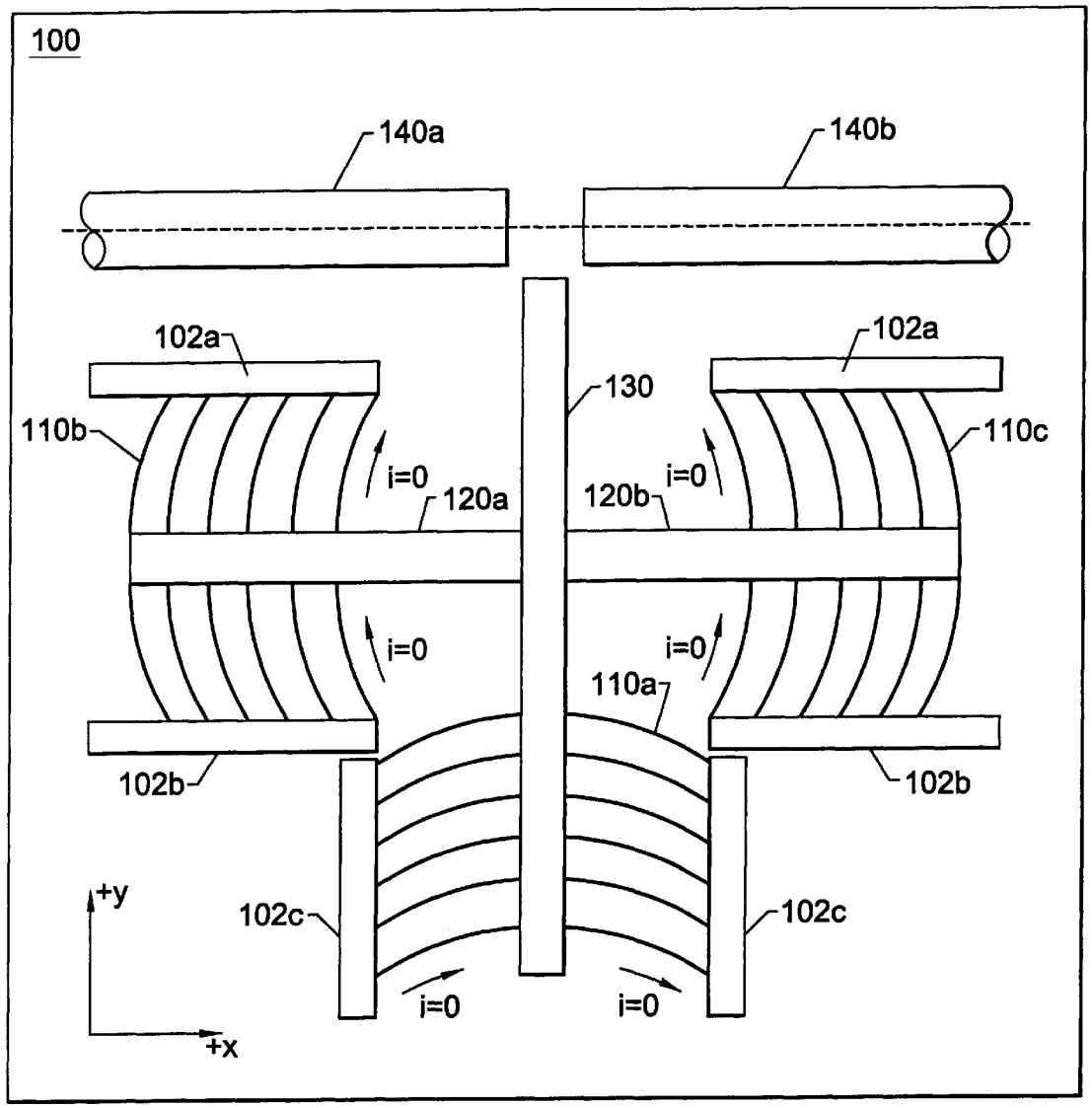
FIG. 1A is a plan view of an optoelectronic device having a normally-open optical shutter, according to a first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Also, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring now to FIG. 1A, a micromechanical optoelectronic device according to a first embodiment of the present invention includes a substrate 100 (e.g., semiconductor substrate) having first and second optical fibers 140a and 140b thereon and preferably mounted thereto. As illustrated, the first and second optical fibers 140a and 140b are positioned so that an end of the first optical fiber faces an end of the second optical fiber. As illustrated by the dotted lines, the optical fibers may also be coaxial. An optical shutter 130 is also provided. This optical shutter 130 is mechanically coupled to a first plurality of arched beams 110a that are supported at opposing ends by support structures 102c which may be mounted on the substrate 100.

A second plurality of arched beams 110b are also provided on a first side of the optical shutter 130. As illustrated, these arched beams 110b are supported at opposing ends by support structures 102a and 102b. These support structures may also be formed as individual support structures for each beam. In addition, a first brake member 120a is provided. This first brake member 120a, which is coupled to the second plurality of arched beams 110b, contacts and restricts the optical shutter from moving in the ±y-direction when the second plurality of arched beams 110b are relaxed, but releases the optical shutter 130 when the second plurality of arched beams 110b move in the −x direction. Similarly, a third plurality of arched beams 110c are also provided on a second side of the optical shutter 130. These arched beams 110c are supported at opposing ends by support structures 102a and 102b. A second brake member 120b is also provided. This second brake member 120b, which is coupled to the third plurality of arched beams 110c, contacts and restricts the shutter member 130 from moving in the ±y direction when the third plurality of arched beams 110c are relaxed, but releases the optical shutter 130 when the third plurality of arched beams 110c move in the +x direction.

Figure 1B:
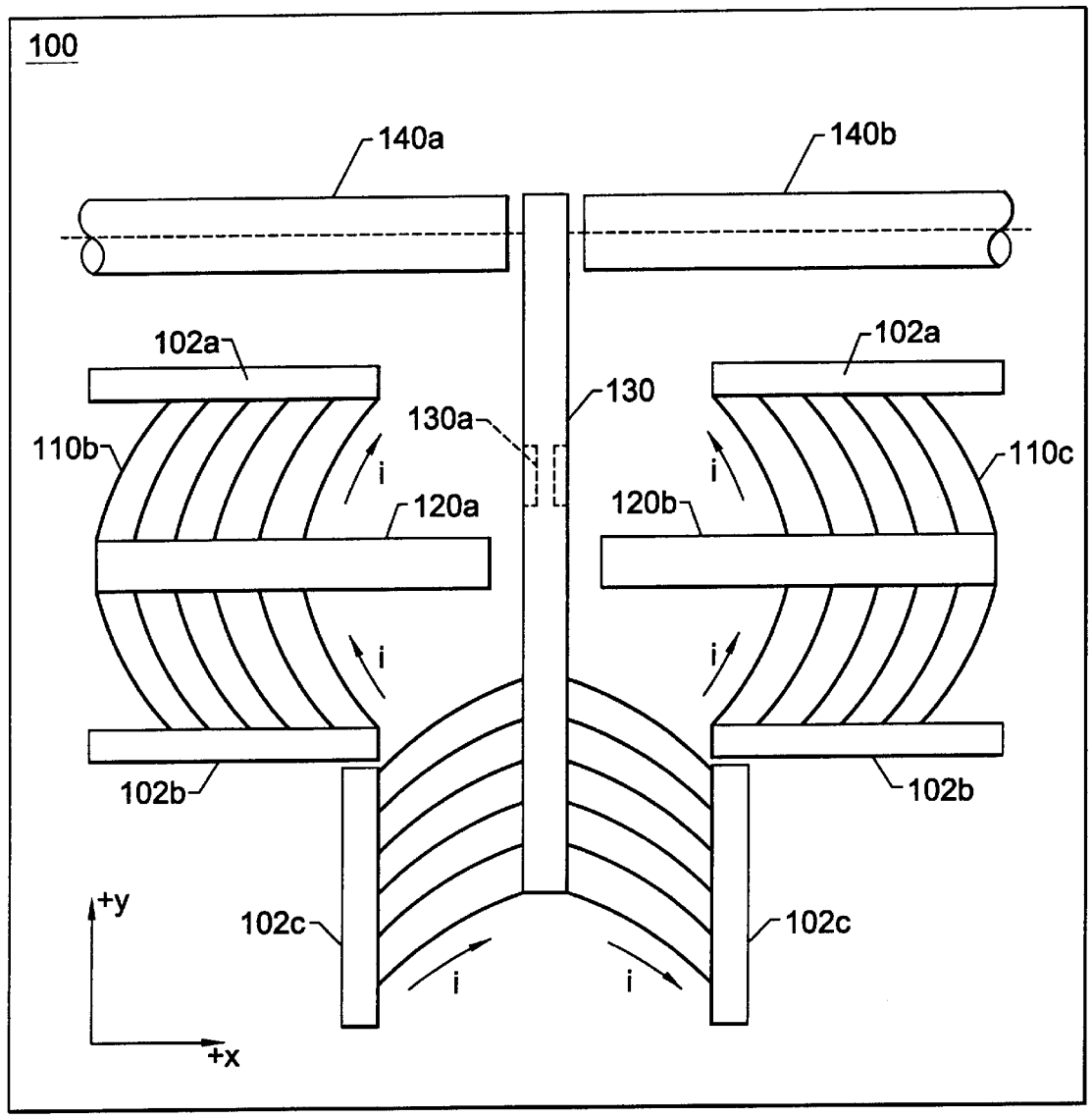
FIG. 1B is a plan view of the optoelectronic device of FIG. 1A when the optical shutter has been moved into a light blocking position by activating a plurality of themally-arched beam structures.
Figure 1C:
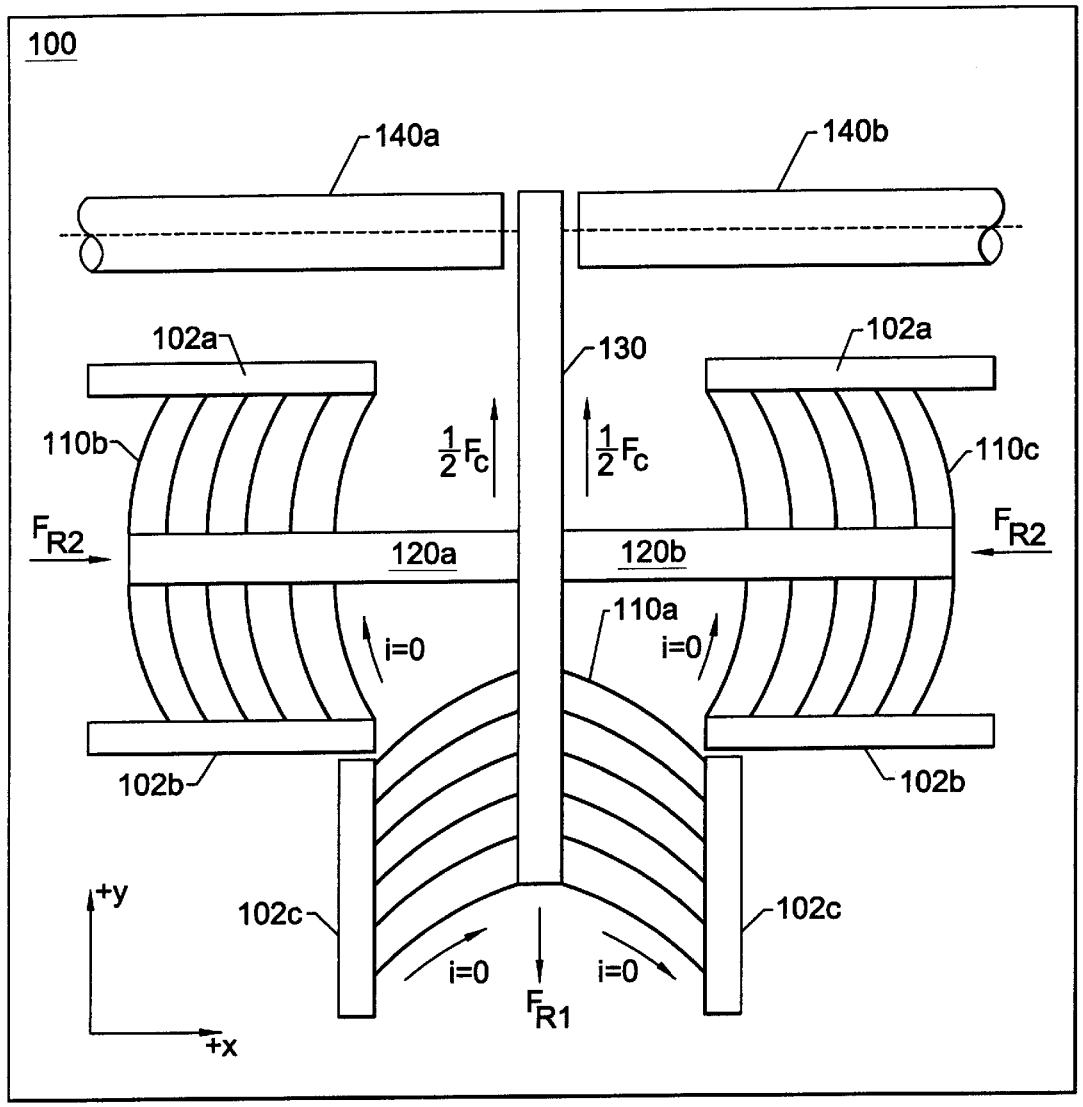
FIG. 1C is a plan view of the optoelectronic device of FIG. 1A after the optical shutter as been clamped in a light blocking position.
Figure 1D:
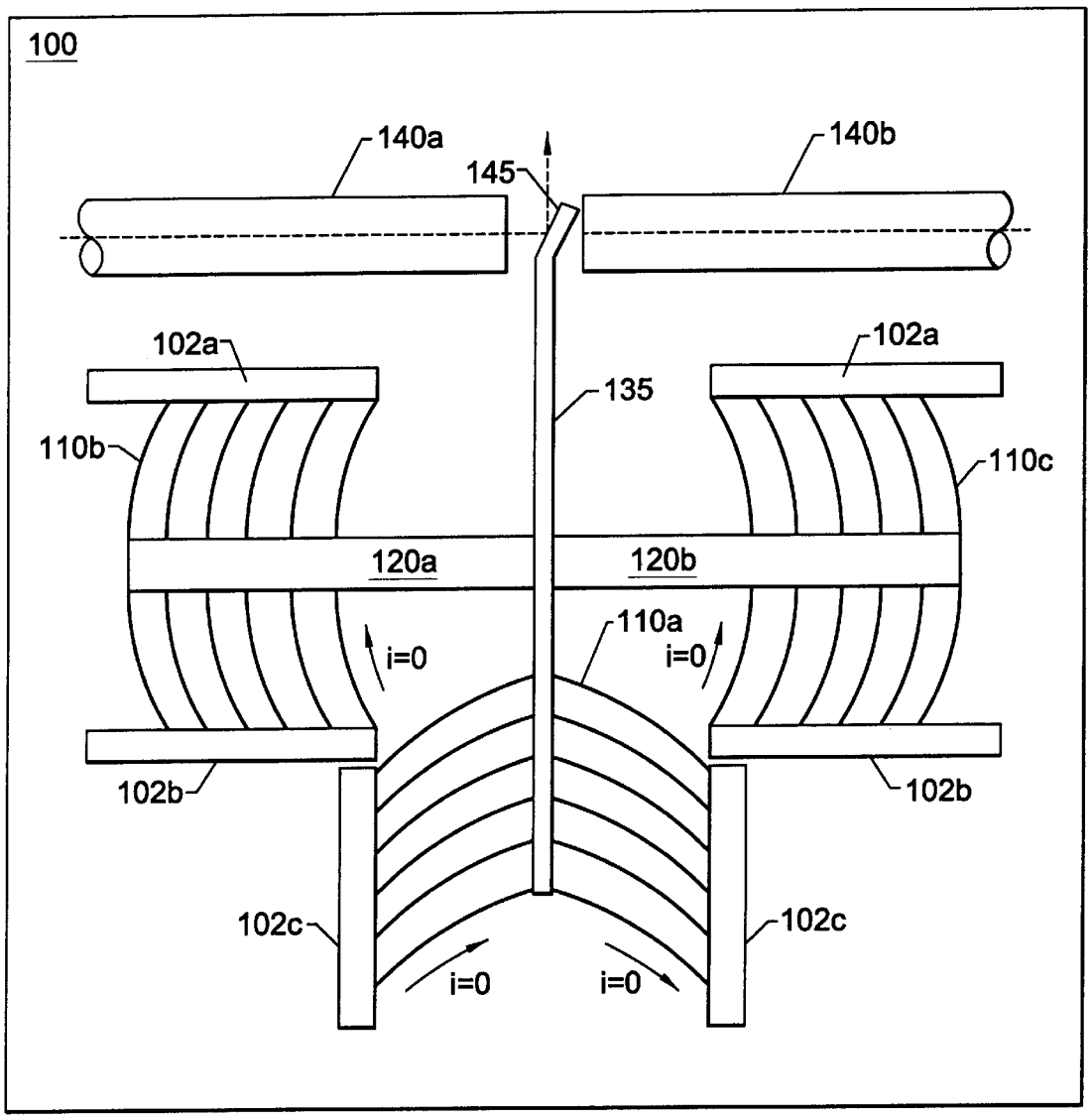
FIG. 1D is a plan view of an optoelectronic device having a normally-open optical shutter, according to a second embodiment of the present invention.
Figure 1E:
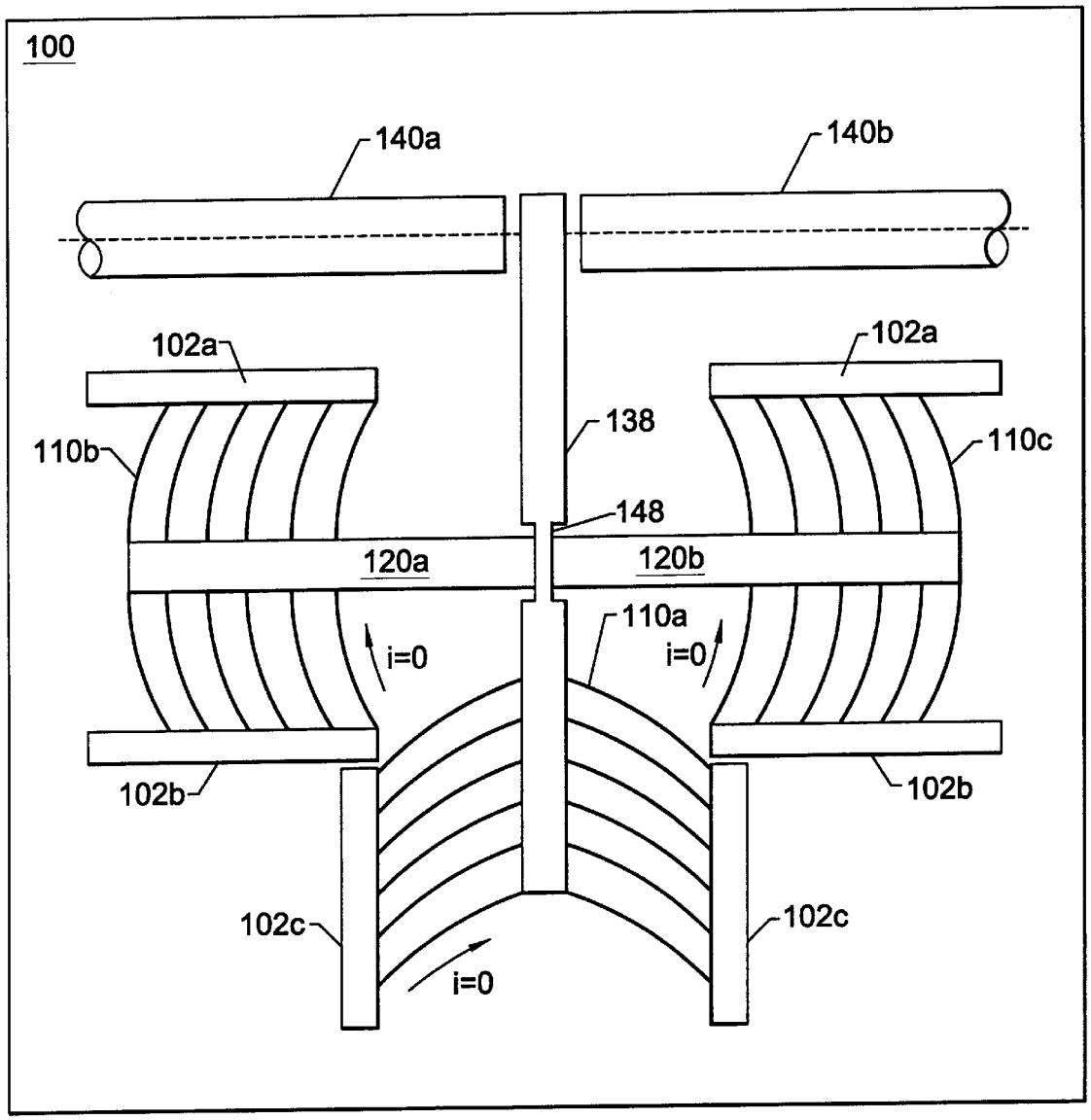
FIG. 1E is a plan view of an optoelectronic device having a normally-open optical shutter, according to a third embodiment of the present invention.
Figure 1F:
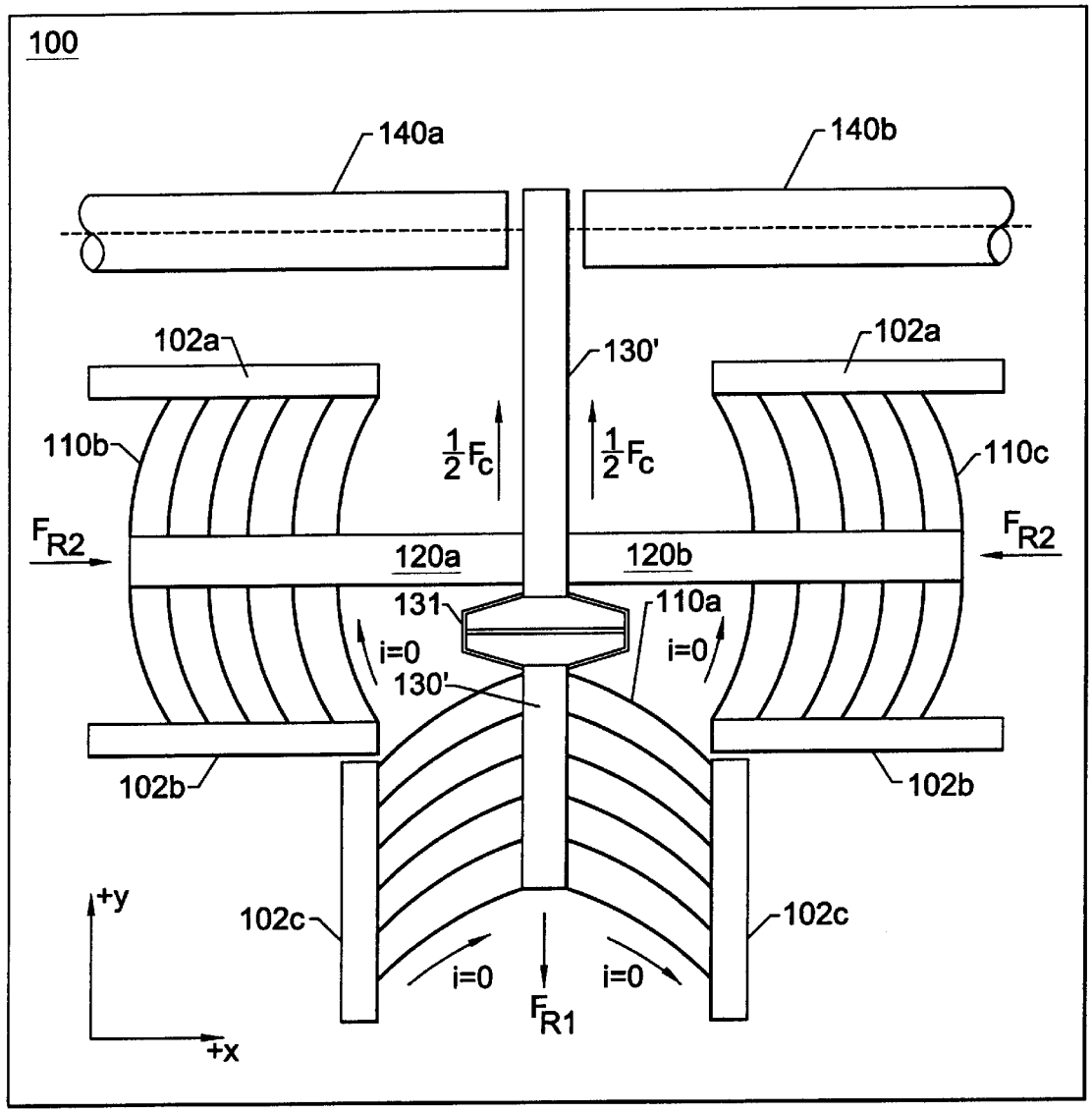
FIG. 1F is a plan view of an optoelectronic device having a normally-open optical shutter, according to a fourth embodiment of the present invention.
Figure 1G:
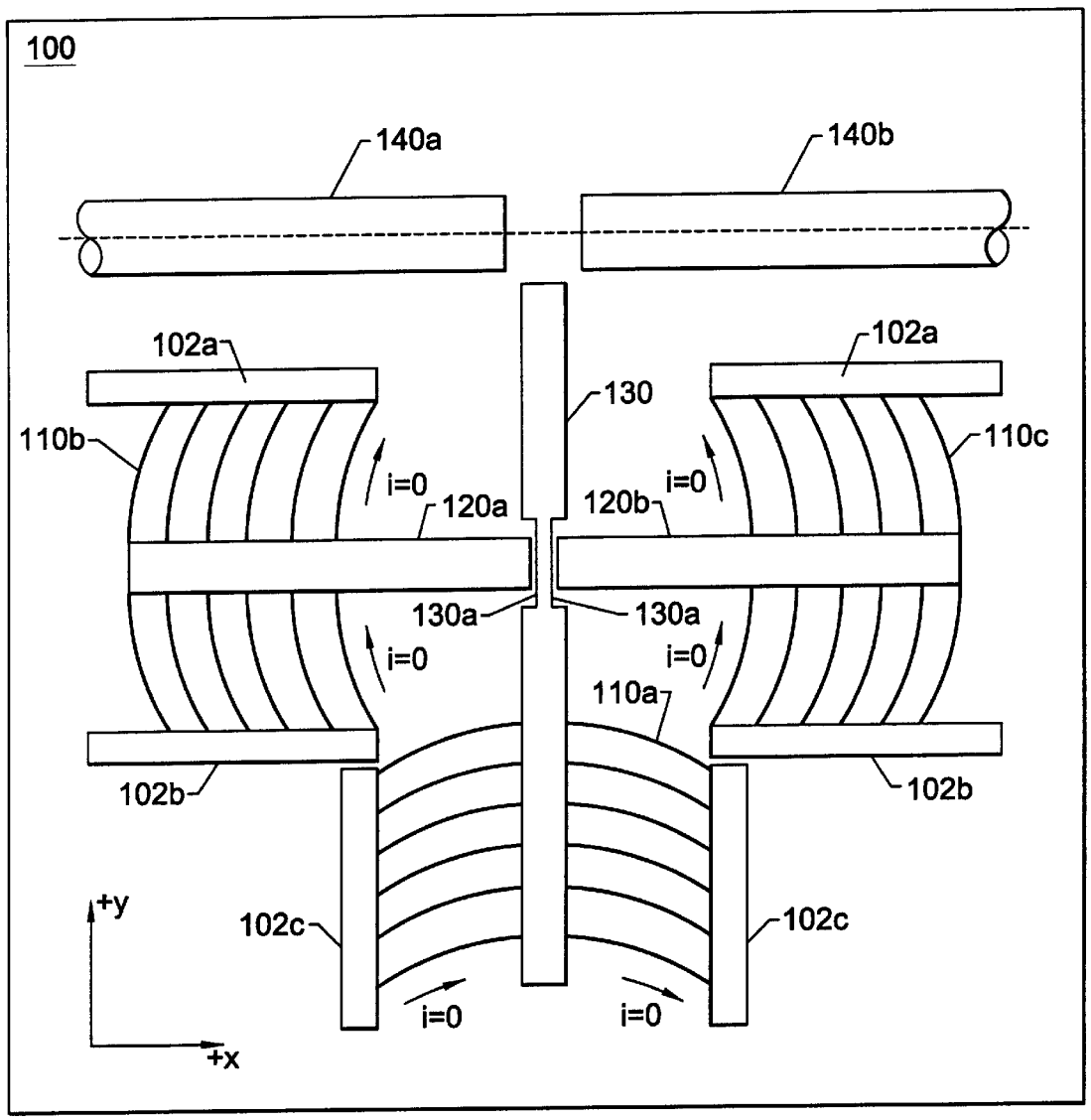
FIG. 1G is a plan view of an optoelectronic device having a normally-open optical shutter, according to a fifth embodiment of the present invention.

As illustrated by FIG. 1G, the optical shutter 130 may also be formed with a pair of opposing grooves 130a that receive ends of the first and second brake members 120a and 120b when the second and third plurality of arched beams 110b and 110c are in relaxed states. The formation of these grooves 130a will facilitate the simultaneously formation (e.g., patterning) of the optical shutter 130 and the first and second brake members 110b and 110c from the same material and may also increase the force applied by the ends of the brake members 120a and 120b when the optical shutter 130 is moved to a light blocking position and the brake members 120a and 120b engage the sides of the optical shutter.

As illustrated by FIG. 1B, the first plurality of arched beams 110a that are mechanically coupled to the optical shutter 130 can be used to control movement of the optical shutter 130 into a gap extending between the ends of the first and second optical fibers 140a and 140b. In this position, the optical shutter 130 can operate to limit the degree of optical coupling between the first and second optical fibers 140a and 140b and can even be positioned to block all light from being transferred from one fiber to the other. As will be understood by those skilled in the art, movement of the first plurality of arched beams 110a and the optical shutter 130 in the +y direction may be controlled with a high degree of precision by establishing a current through one or more of the arched beams 110a. This current operates to heat the arched beams 110a (through resistive heating) and causes the "thermally" arched beams to expand and become displaced in the +y direction by a distance proportional to the magnitude of the current. One or more heaters disposed adjacent the beams may also be used to provide conduction heating and expansion of the arched beams. The mechanical coupling between the optical shutter 130 and the first plurality of arched beams 110a translates into movement of the optical shutter 130 in the +y direction (assuming no restriction against movement) when the first plurality of arched beams 110a expand. The construction and operation of thermally-arched beams as microelectromechanical actuators, switching arrays and positioning apparatus is more fully described in detail in U.S. Pat. No. 5,870,518 to Haake et al., entitled "Microactuator for Precisely Aligning an Optical Fiber and an Associated Fabrication Method", U.S. Pat. No. 5,909,078 to Wood et al, entitled "Thermal Arched Beam Microelectromechanical Actuators", U.S. Pat. No. 5,955,817 to Dhuler et al., entitled "Thermal Arched Beam Microelectromechanical Switching Array" and U.S. Pat. No. 5,962,949 to Dhuler et al. entitled "Microelectromechanical Positioning Apparatus", the disclosures of which are hereby incorporated herein by reference.

According to a preferred aspect of the present invention, the first and second brake members 120a and 120b and the second and third pluralities of arched beams 110b and 110c (and supports 102a, 102b) may collectively form a "normally-locked" brake assembly that may be used in a plurality of micromechanical devices in addition to micromechanical optoelectronic devices. In particular, the preferably diametrically opposing ends of the first and second brake members 120a and 120b contact and restrict movement of the optical shutter 130 when the second and third pluralities of arched beams 110b and 110c are in relaxed states (i.e., the temperatures of the arched beams 110b and 110c are below of threshold temperature). These relaxed states may be achieved by actively cooling the arched beams 110b and 110c or, more preferably, preventing appreciable current "i" from flowing through the second and third pluralities of arched beams 110b and 110c (e.g., "i"=0). However, as illustrated by FIG. 1B, movement of the optical shutter 130 may be achieved by simultaneously establishing a sufficiently large current "i" through the first, second and third pluralities of arched beams 110a, 110b and 110c.

Moreover, as illustrated best by FIG. 1C, by returning the second and third pluralities of arched beams 110b and 110c to their respective relaxed states before the first plurality of arched beams 110a are returned to their respective relaxed states, the optical shutter 130 can be clamped in a blocking state where the first and second optical fibers 140a and 140b are partially or completely optically decoupled from each other. Here, the frictional clamping force ($F_c$) provided by the opposing first and second brake members 120a and 120b should preferably be greater than the relaxation force ($F_{R1}$) that the first plurality of arched beams 110a apply to the optical shutter 130 when the current through the plurality of arched beams 110a is terminated and/or temperature is reduced below the threshold. If this condition is met, non-volatile position retention can be achieved since removal of power from the optoelectronic device will not disturb the clamped position of the optical shutter 130. According to a preferred aspect of the present invention, the magnitude of the frictional clamping force $F_c$ can be increased by increasing the number of beams in the second and third pluralities of arched beams 110b and 110c. For example, the number of arched beams should be chosen so that:

$$F_c = (F_{R2}\mu_S + F_{R3}\mu_S) > F_{R1} \qquad (1)$$

where $FR_2$ and $FR_3$ are the relaxation forces that the second and third pluralities of arched beams 110b and 110c apply to the first and second brake members 120a and 120b and $\mu_S$ is the coefficient of static friction which applies to the interfaces between the opposing sides of the optical shutter 130 and the opposite ends of the brake members 120a and 120b. This coefficient of static friction may be increased by controlling the roughness of the ends of the brake members 120a and 120b and/or roughness of the sides of the optical shutter 130. Alternatively, as illustrated by FIG. 1F, a spring 131 element may be incorporated within an optical shutter 130' so that the frictional clamping force ($F_c$) need not be as great as the above equation requires. In particular, the spring element 131 can reduce the effective relaxation force that is transferred to the end of the optical shutter 130' when the brake assembly is in the clamped position.

Referring now to FIG. 1D, an optoelectronic device according to a second embodiment of the present invention is similar to the embodiment illustrated by FIGS. 1A–1C, however, an optical shutter 135 is provided for directing light away from the axis of the first optical fiber 140a. As illustrated, this optical shutter 135 has a mirror surface 145 on a distal end thereof that is disposed at an angle relative to the axis of the first optical fiber 140a. An optoelectronic device according to a third embodiment of the present invention is illustrated by FIG. 1E. This third embodiment is similar to the embodiment of FIGS. 1A–1C, however, the optical shutter 138 is provided having a notch 148 therein. This notch 148 may improve the clamping reliability of the first and second brake members 120a and 120b in the event the relationship defined above by equation (1) is not met. Although not shown, the optical shutter 138 may include a plurality of notches disposed side-by-side along the length of the shutter. These plurality of notches may be provided so that nonvolatile retention of a plurality of clamped positions is more easily achievable.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A micromechanical brake assembly, comprising:
   a substrate;
   a first beam that is coupled to said substrate and moves in a first direction upon expansion thereof;
   a first brake member that is coupled to said first beam so that movement of said first beam in the first direction causes movement of said first brake member in the first direction;
   a second beam that is coupled to said substrate and moves in a second direction opposite the first direction upon expansion thereof;
   a second brake member that is disposed opposite said first brake member and is coupled to said second beam so that movement of said second beam in the second direction causes movement of said second brake member in the second direction;
   a braking element disposed between said first and second brake members; and
   means, coupled to said substrate, for moving said braking element in a third direction orthogonal to the first direction.

2. The brake assembly of claim 1, wherein said first and second brake beams move away from each other when said first and second members are moved in the first and second directions, respectively.

3. The brake assembly of claim 2, wherein said first and second beams comprise first and second materials, respectively; and wherein the first and second materials have positive coefficients of thermal expansion.

4. The brake assembly of claim 3, wherein said first and second brake members contact opposing sides of said braking element when said first and second beams are in relaxed states; and wherein movement of said first beam in the first direction releases said first brake member from said braking element.

5. The brake assembly of claim 4, wherein said means for moving said braking element comprises a thermally arched beam coupled to said substrate.

6. The brake assembly of claim 4, wherein irrespective of the position of said braking element, said first brake member contacts said braking element when said first beam is in the relaxed state.

7. A micromechanical shutter, comprising:
   a first arched beam suspended opposite a substrate having a light path proximate thereto, said first arched beam comprising a material having a positive coefficient of thermal expansion so that upon expansion thereof said first arched beam moves in a first direction;
   a shutter member that is mechanically coupled to said first arched beam so that movement of said first arched beam in the first direction causes movement of said shutter member into the light path; and
   a brake assembly, said brake assembly comprising:
      a second arched beam suspended opposite the substrate on a first side of said shutter member, said second arched beam comprising a material having a positive coefficient of thermal expansion so that upon expansion thereof said second arched beam moves in a second direction;
      a first brake member that is mechanically coupled to said second arched beam so that movement of said second arched beam in the second direction causes movement of said first brake member in the second direction;
      a third arched beam suspended opposite the substrate on a second side of said shutter member, said third arched beam comprising a material having a positive coefficient of thermal expansion so that upon expansion thereof said third arched beam moves in a third direction opposite the second direction; and a second brake member that is mechanically coupled to said third arched beam so that movement of said third arched beam in the third direction causes movement of said second brake member in the third direction.

8. The shutter of claim 7, wherein said shutter member has a mirror surface thereon that deflects light from the light path when said first arched beam moves in the first direction.

9. The shutter of claim 7, wherein the first direction is orthogonal to the second direction.

10. The shutter of claim 7, wherein said first brake member contacts said shutter member when said second arched beam is in a relaxed state; and wherein movement of said second arched beam in the second direction releases said first brake member from said shutter member.

11. The shutter of claim 10, wherein said second brake member contacts said shutter member when said third arched beam is in a relaxed state; and wherein movement of said third arched beam in the third direction releases said second brake member from said shutter member.

12. The shutter of claim 11, wherein said first and second brake members contact diametrically opposite sides of said shutter member when said second and third arched beams are in their relaxed states.

13. The shutter of claim 10, wherein said shutter member has a notch therein; and wherein said first brake member extends into the notch when said second arched beam is in its relaxed state.

14. An optoelectronic device, comprising:
a substrate having first and second optical fibers mounted thereon so that an end of said first optical fiber faces an end of said second optical fiber;
a shutter member;
means, coupled to said substrate, for moving said shutter member into a gap extending between the ends of said first and second optical fibers;
a first beam that is coupled to said substrate on a first side of said shutter member and moves in a first direction upon expansion thereof; and
a first brake member that is coupled to said first beam, contacts and restricts said shutter member from moving when said first beam is in a relaxed state and releases said shutter member when said first beam moves in the first direction.

15. The device of claim 14, further comprising:
a second beam that is coupled to said substrate on a second side of said shutter and moves in a second direction upon expansion thereof; and
a second brake member that is coupled to said second beam, contacts and restricts said shutter member from moving when said second beam is in a relaxed state and releases said shutter member when said second beam moves in the second direction.

16. The shutter of claim 15, wherein said first and second brake members contact diametrically opposite sides of said shutter member when said first and second beams are in relaxed states.

17. The device of claim 15, wherein the gap between the end of said first optical fiber and said second optical fiber is sufficiently small so that light emitted from the end of said first optical fiber is received at the end of said second optical fiber; and wherein said shutter member has a mirror surface thereon that deflects light from within the gap to external the gap when the shutter member is in the gap.

18. The device of claim 16, wherein said shutter member has a notch therein; and wherein said first brake member extends into the notch when said first arched beam is in its relaxed state.

19. The device of claim 14, wherein irrespective of the position of said shutter member, said first brake member contacts said shutter member when said first beam is in the relaxed state.

20. The device of claim 19, further comprising:
a second beam that is coupled to said substrate on a second side of said shutter member and moves in a second direction upon expansion thereof; and
a second brake member that is coupled to said second beam, contacts and restricts said shutter member from moving when said second beam is in a relaxed state and releases said shutter member when said second beam moves in the second direction.

21. The device of claim 14, wherein said shutter member comprises a spring element therein.

22. The device of claim 21, wherein said moving means comprises at least one arched beam that is mechanically coupled to a first end of the spring element.

23. A micromechanical device, comprising:
a braking element; and
a nonvolatile brake assembly that can clamp said braking element in a fixed position.

* * * * *